(12) United States Patent
Kaneko et al.

(10) Patent No.: US 7,422,443 B2
(45) Date of Patent: Sep. 9, 2008

(54) ELECTRIC CONNECTION BOX

(75) Inventors: Nobutaka Kaneko, Kakegawa (JP);
Akemi Maebashi, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/785,613

(22) Filed: Apr. 19, 2007

(65) Prior Publication Data
US 2007/0249189 A1 Oct. 25, 2007

(30) Foreign Application Priority Data
Apr. 19, 2006 (JP) ............................. 2006-116022

(51) Int. Cl.
*H01R 12/00* (2006.01)
(52) U.S. Cl. .................................. 439/76.2
(58) Field of Classification Search .............. 439/76.2, 439/446, 212, 464, 472, 473, 949, 892, 466, 439/658, 506, 610, 359, 372, 535; 174/59, 174/72 A, 480, 66, 68.1, 72 C, 72 R
See application file for complete search history.

(56) References Cited

U.S. PATENT DOCUMENTS

| 5,315,062 | A | * | 5/1994 | Hoshino | 439/446 |
| 6,056,587 | A | * | 5/2000 | Matsuoka et al. | 439/464 |
| 7,132,600 | B2 | * | 11/2006 | Kaneko | 174/480 |
| 2006/0121760 | A1 | * | 6/2006 | Kaneko | 439/212 |

FOREIGN PATENT DOCUMENTS

| JP | 2001-211528 A | 8/2001 |
| JP | 2001-352640 A | 12/2001 |

\* cited by examiner

*Primary Examiner*—Edwin A. León
(74) *Attorney, Agent, or Firm*—Sughrue Mion, PLLC

(57) ABSTRACT

An electric connection box includes a harness holding portion formed on a lower wall of a lower cover and extending downwardly from the lower cover, and a fixing member which fixes a wire harness, led out through a harness lead-out through hole, to the harness holding portion.

4 Claims, 4 Drawing Sheets

ELECTRIC CONNECTION BOX

BACKGROUND OF THE INVENTION

1. Field of the Invention

This invention relates to an electric connection box (i.e., an electric junction box) such for example as a relay box, a fuse box and an electronic control unit box) used in a vehicle such as an automobile, and more particularly to an electric connection box in which a wire harness electrically connected to electrical parts (such as relays, fuses and, electronic control units) is bent in such a manner that a direction of leading of the wire harness out of the electric connection box is regulated to a predetermined direction.

2. Related Art

Electric connection boxes for automobiles are broadly classified into two kinds, that is, the type to be mounted within a passenger compartment and the type to be suitably mounted within an engine room. The electric connection box mounted within the passenger compartment will not basically be exposed to rain and others, and therefore it is not necessary to give much consideration to the waterproofing. In contrast, in the electric connection box mounted within the engine room, a tray-like upper cover and a tray-like lower cover are attached to a connection box body (i.e., a frame-like case) in order not only to achieve the waterproofing but also to prevent dust, dirt and the like from intruding into the engine room.

More specifically, the electric connection box to be mounted within the engine room comprises the connection box body having a plurality of electrical parts mounted thereon, the lower cover attached to a lower portion of the connection box body to cover a bundle of wires (that is, a wire harness) electrically connected to the electrical parts and extending downwardly from the connection box body, and the upper cover attached to an upper portion of the connection box body to cover an upper surface of this connection box body.

Incidentally, within the engine room, a space can be more easily obtained in a direction of a height (that is, a vertical direction) than in a lateral direction (that is, a horizontal direction), and therefore electric connection boxes of the type in which the wire harness is led downwardly out of a lower cover have increasingly be used in automobiles (see, for example, JP-A-2001-211528 Publication).

Among the electric connection boxes in which the wire harness is led downwardly out of the lower cover, there is the type further including a side cover having a plate-like harness holding portion which is fixed to the wire harness by a fixing member such as an adhesive tape and a binding band (see, for example, JP-A-2001-352640 Publication). In the electric connection box having such a side cover, one continuous harness lead-out through hole is formed through a lower wall and a side wall of the lower cover. The wire harness is led out of the lower cover through the harness lead-out through hole, and in this condition the side cover is attached to the lower cover to close an opening of the harness lead-out through hole formed in a side surface (that is, the side wall) of the lower cover. At this time, the wire harness led out of the lower cover is held by the fixing member on the harness holding portion of the side cover which extends downwardly from the vicinity of an opening of the harness lead-out through hole formed in a lower surface (that is, the lower wall) of the lower cover, and therefore the direction of leading-out of the wire harness is regulated to a downward direction relative to the lower cover. In the operation for assembling the electric connection box of this structure, the operation for the leading-out of the wire harness is carried out in the following manner.

First, the connection box body is disposed upside down (that is, the upper surface of the connection box body is directed downward while the lower surface of the connection box body is directed upward) so that the wire harness leading-out operation can be effected easily, and in this condition the wire harness extending from the lower surface of the connection box body is passed through the harness lead-out through hole in the lower cover. Then, the lower cover is attached to the connection box body while engaging engagement portions of the lower cover with respective retaining portions of the connection box body. At this time, most of wires of the wire harness are bent generally at a right angle partly because an inner surface (particularly an upper surface of the lower wall of the lower cover facing away from the lower surface thereof) of the lower cover is pressed against these wires, and the wires extend along the inner surface of the lower cover, and are led out through the harness lead-out through hole (When the wire harness is thick, and can not be easily bent, the wires are led to the exterior mainly through the opening of the harness lead-out through hole formed in the side surface of the lower cover.). Then, the harness holding portion of the side cover is fixed by the fixing member (such as an adhesive tape and a binding band) to a predetermined portion of the wire harness led out of the lower cover. Then, that portion of the wire harness spaced slightly from the fixing member toward the connection box body is bent generally at a right angle so that the wire harness extends upwardly from the opening of the harness lead-out through hole formed in the lower surface of the lower cover (That portion of the wire harness led out of the lower cover extends downwardly when this electric connection box is actually mounted on the vehicle.), and in this condition engagement portions of the side cover are engaged respectively with retaining portions of the lower cover to thereby attach the side cover to the side surface of the lower cover,.

In such an electric connection box, particularly when the wire harness is so thick as not to be easily bent, the worker must engage the engagement portions of the lower cover with the respective retaining portions of the connection box body with a larger force against the spring back of the wire harness (that is, an elastic restoring force of the wire harness), that is, in a manner to forcibly press the side cover, and this engaging operation can not be carried out easily, and therefore the efficiency of the assembling operation is low. And besides, when attaching the side cover to the lower cover in the condition in which the harness holding portion of the side cover is fixed to the wire harness, the wire harness must sometimes be forcibly twisted, and therefore an improvement is necessary in view of the efficiency of the assembling operation. Furthermore, the wire harness need to have a surplus portion for bringing the engagement portions of the side cover into engagement with the respective retaining portions of the lower cover, and this is a waste of resources.

SUMMARY OF THE INVENTION

This invention has been made in view of the above circumstances, and an object of the invention is to provide an electric connection box in which the efficiency of an assembling operation, in which a wire harness extending from a lower surface of a connection box body is bent so as to be led downwardly out of the lower cover, with the lower cover attached to a lower portion of the connection box body, is enhanced, and also a surplus portion of the wire harness which has been required for attaching a side cover to the lower cover can be completely eliminated.

The above object has been achieved by an electric connection box of the present invention having features recited in the following Paragraphs (1) to (4).

(1) An electric connection box characterized in that the electric connection box comprises:

a connection box body;

a wire harness extending from a lower surface of the connection box body;

a lower cover including a lower wall, a side wall extending upwardly from a peripheral edge of the lower wall, and one continuous harness lead-out through hole formed through the lower wall and the side wall, the lower cover being attached to a lower portion of the connection box body in such a manner that the wire harness is led to the exterior through the harness lead-out through hole;

a side cover which is attached to the lower cover to cover an opening of the harness lead-out through hole in the side wall in a condition in which the wire harness is bent and led downwardly out of the lower cover through an opening of the harness lead-out through hole in the lower wall;

a harness holding portion which is formed on the lower wall and extends downwardly from the lower cover; and a fixing member which fixes the wire harness, led out through the harness lead-out through hole, to the harness holding portion.

(2) The electric connection box of the above Paragraph (1) is characterized in that the harness holding portion is disposed in the vicinity of the opening of the harness lead-out through hole formed in the lower wall of the lower cover.

(3) The electric connection box of the above Paragraph (2) is characterized in that the harness holding portion extends from that portion of the lower wall defining the opening of the harness lead-out through hole.

(4) The electric connection box of any of the above Paragraphs (1) to (3) is characterized in that a plurality of wires of the wire harness extend from the lower surface of the connection box body, and further extend along an upper surface of the lower wall of the lower cover, and then are bent, and extend downwardly from the lower wall of the lower cover through the harness lead-out through hole; and the upper surface of the lower wall is a slanting surface slanting downwardly toward the opening of the harness lead-out through hole formed in the lower wall.

The electric connection box of the construction of the above Paragraph (1) includes the harness holding portion formed on the lower wall and extending downwardly from the lower cover, and the fixing member fixing the wire harness, led out through the harness lead-out through hole, to the harness holding portion. Therefore, even if the wire harness is thick, and can not easily be bent, it is only necessary to fix the wire harness to the harness holding portion of the lower cover by the fixing member and then to attach the side cover to the lower cover. And besides, the wire harness will not be unduly twisted, and therefore the efficiency of the assembling operation is good. Furthermore, in the electric connection box of the construction of the above Paragraph (1), a surplus portion of the wire harness which has heretofore been required for attaching the side cover to the lower cover can be completely eliminated, and this can save resources.

In the electric connection box of the construction of the above Paragraph (2), the harness holding portion is disposed in the vicinity of the opening of the harness lead-out through hole formed in the lower wall of the lower cover, and therefore the harness holding portion can stably hold that portion of the wire harness disposed in the vicinity of the bent portion thereof.

In the electric connection box of the construction of the above Paragraph (3), the harness holding portion extends from the portion of the lower wall defining the opening of the harness lead-out through hole, and therefore the radius of curvature of the bent portion of the wire harness can be easily made small. Therefore, the bulging of the bent portion of the wire harness toward the side cover can be suppressed, and therefore the wire harness will not prevent the mounting of the side cover on the lower cover.

In the electric connection box of the construction of the above Paragraph (4), the upper surface of the lower wall of the lower cover is the slanting surface slanting downwardly toward the opening of the harness lead-out through hole formed in the lower wall, and therefore the bending of the wire harness required for the leading of the wire harness downwardly out of the lower cover can be made gentle. Therefore, the efficiency of the operation for fixing the wire harness to the harness holding portion by the fixing member is markedly enhanced.

In the present invention, the efficiency of the assembling operation, in which the wire harness extending from the lower surface of the connection box body is bent so as to be led downwardly out of the lower cover, with the lower cover attached to the lower portion of the connection box body, is enhanced, and also a surplus portion of the wire harness which has been required for attaching the side cover to the lower cover can be completely eliminated.

The present invention has been briefly described above. Details of the invention will become more manifest upon reading the following Section "DETAILED DESCRIPTION OF THE PREFERRED EMBODIMENTS" with reference to the accompanying drawings.

DETAILED DESCRIPTION OF THE PREFERRED EMBODIMENTS

A preferred embodiment of the present invention will now be described in detail with reference to FIGS. 1 to 4.

Figure 1:
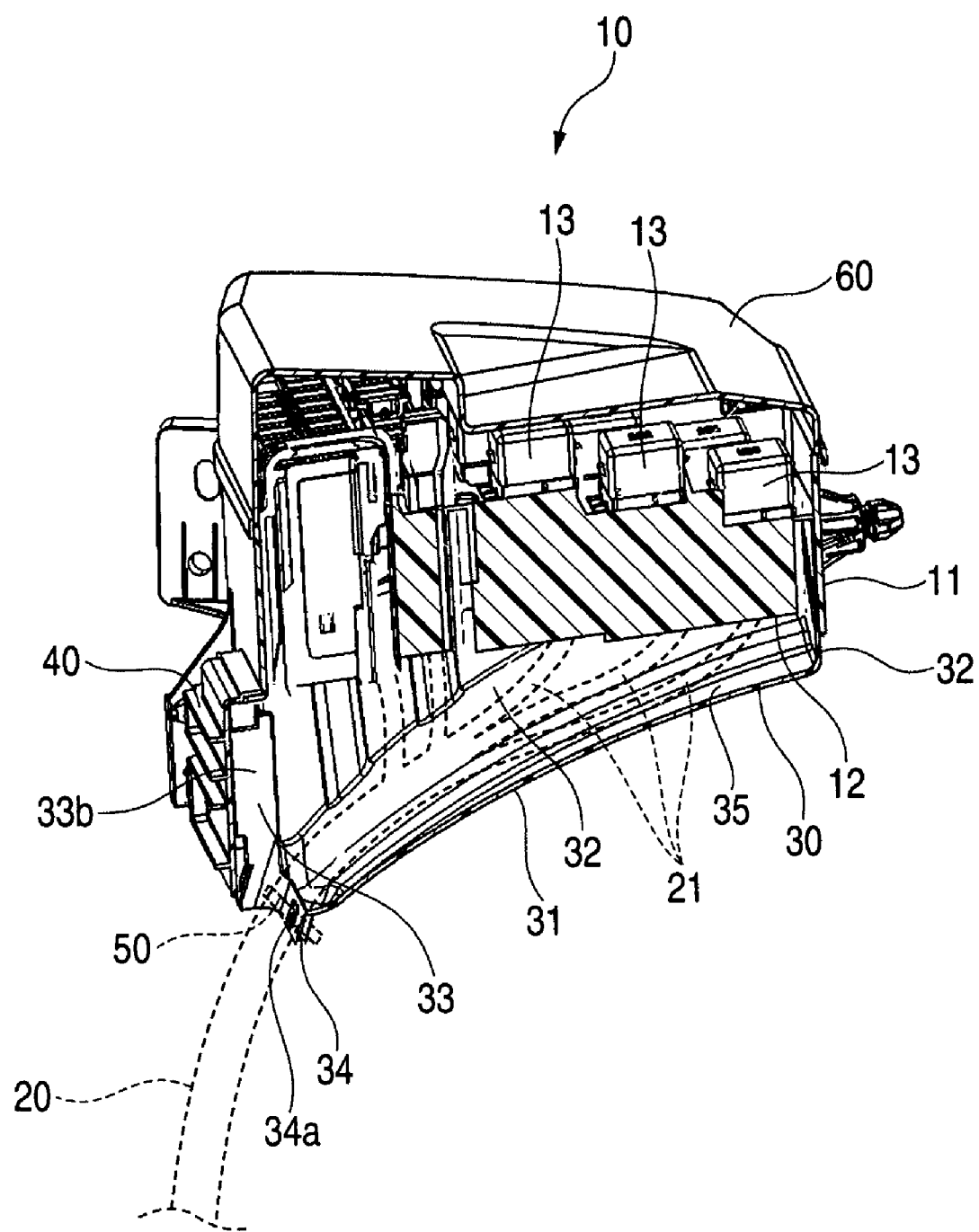
FIG. 1 is a vertical cross-sectional view of one preferred embodiment of an electric connection box of the present invention.

FIG. 1 is a vertical cross-sectional view of one preferred embodiment of an electric connection box of the invention.

As shown in FIG. 1, the electric connection box 10 embodying the invention is adapted to be mounted within an engine room, and comprises a connection box body 11, a wire harness 20 having wires 21 extending from a lower surface 12 of the connection box body 11, and a lower cover 30 molded of an insulative synthetic resin. The lower cover 30 includes a lower wall 31, and a side wall 32 extending upwardly from a peripheral edge of the lower wall 31. The lower cover 30 has one continuous harness lead-out through hole 33 formed through the lower wall 31 and the side wall 32. This lower cover 30 is attached to a lower portion of the connection box body 11 in such a manner that the wire harness 20 is led to the exterior through the harness lead-out through hole 33. The electric connection box 10 further includes an upper cover 60 which is attached to an upper portion of the connection box body 11 to cover an upper surface of this connection box body 11. This upper cover 60 is also molded of an insulative synthetic resin.

The connection box body 11 comprises a box-like case molded of an insulative synthetic resin, and a plurality of electrical parts 13 such for example as relays, fuses and, electronic control units are mounted on this case (More specifically, the electrical parts 13 are electrically connected to metal terminals (not shown) provided at the case.), and these electrical parts 13 are electrically connected to the wires 21 through the metal terminals (not shown). The plurality of wires 21 are joined together into a bundle by winding an adhesive tape or the like on an outer periphery of the bundle, thus forming the wire harness 20.

The electric connection box 10 further includes a side cover 40 molded of an insulative synthetic resin, a harness holding portion 34, and a fixing member 50. The side cover 40 is attached to the lower cover 30 to cover an opening 33b of the harness lead-out through hole 33 formed in the side wall 32 in such a manner that the wire harness 20 is bent, and is led downwardly out of the lower cover 30 through an opening 33a of the harness lead-out through hole 33 formed in the lower wall 31. The harness holding portion 34 is formed integrally with the lower wall 31, and extends downwardly from the lower cover 30. The fixing member 50 is, for example, an adhesive tape, a binding band or the like, and fixes the wire harness 20, led out through the harness lead-out through hole 33, to the harness holding portion 34.

The harness holding portion 34 is disposed in the vicinity of the opening 33a of the harness lead-out through hole 33 formed in the lower wall 31 of the lower cover 30. More specifically, this harness holding portion 34 extends from that portion of the lower wall 31 defining the opening 33a of the harness lead-out through hole 33.

The plurality of wires 21 of the wire harness 20 extend from the lower surface 12 of the connection box body 11, and further extend along an upper surface 35 of the lower wall 31 of the lower cover 30, and then are bent within the lower cover 30, and then pass through the harness lead-out through hole 33, and extend downwardly from the lower wall 31 of the lower cover 31. The upper surface 35 of the lower wall 31 is a slanting surface slanting downwardly toward the opening 33a of the harness lead-out through hole 33 formed in the lower wall 31.

Figure 2:
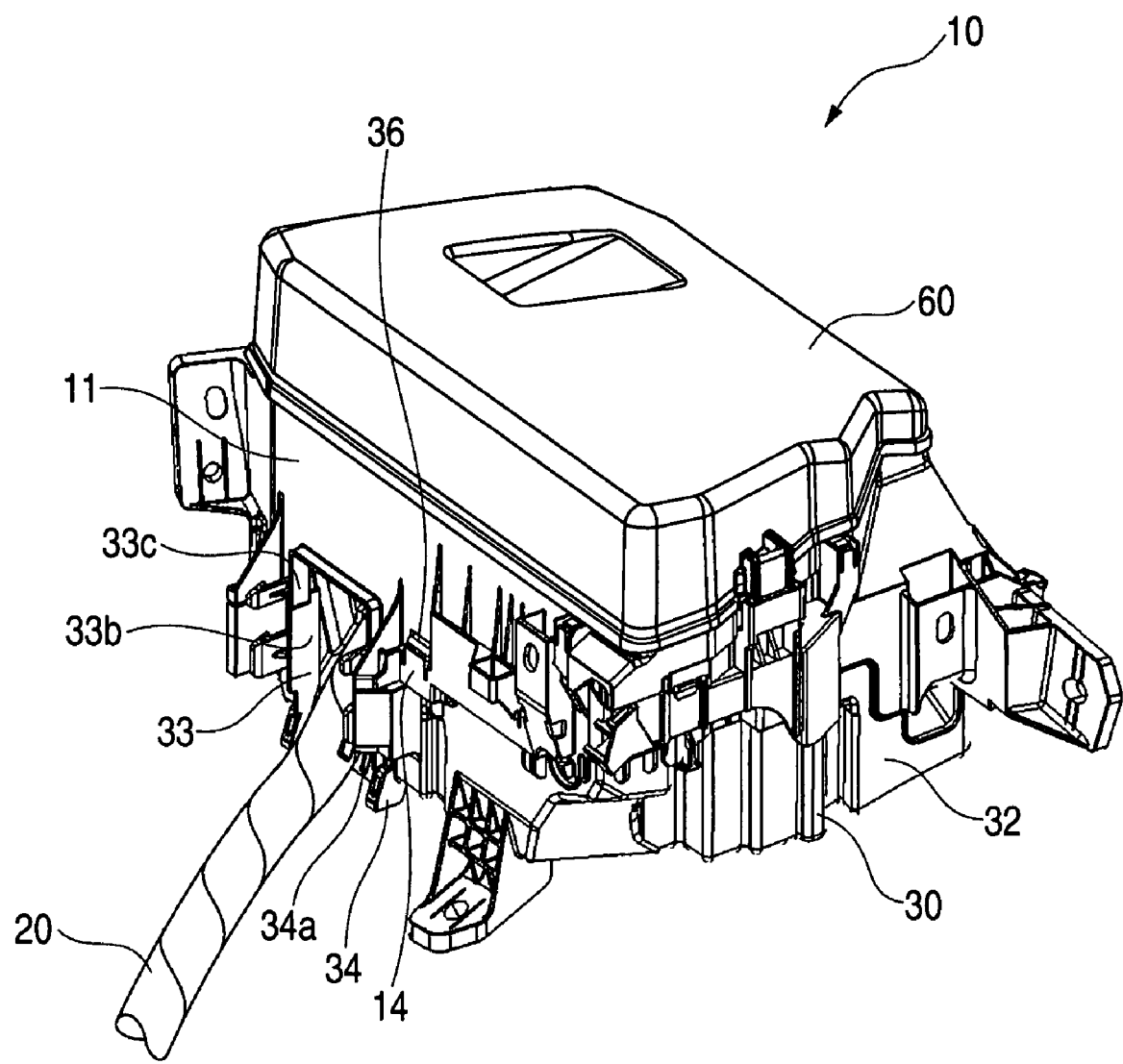
FIG. 2 is a perspective view of the electric connection box explanatory of an operation for the leading-out of a wire harness in an operation for assembling the electric connection box of FIG. 1, showing a condition in which a lower cover is attached to a lower portion of a connection box body, with the wire harness led to the exterior through a harness lead-out through hole.
Figure 3:
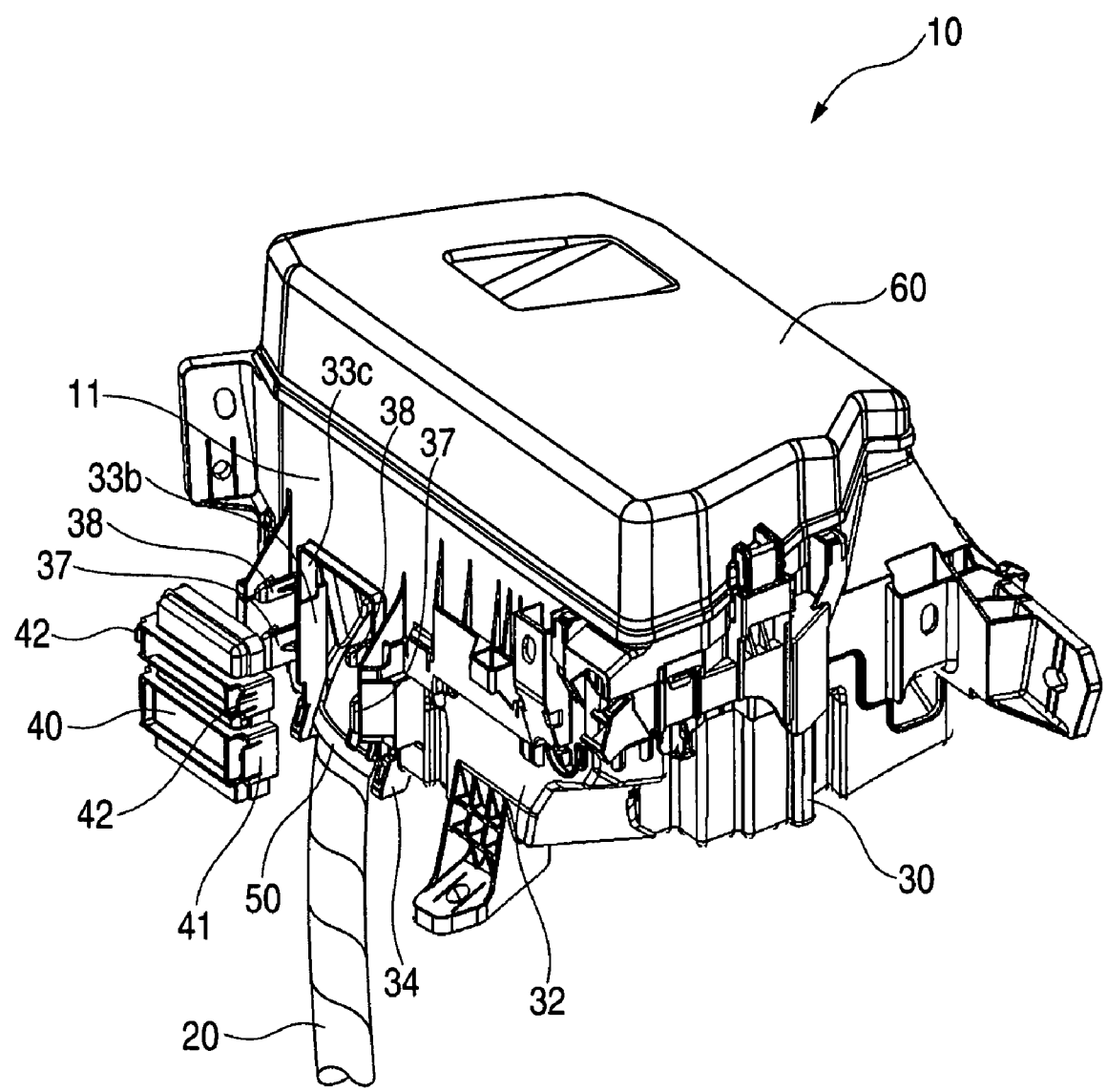
FIG. 3 is a perspective view of the electric connection box explanatory of a step next to the wire harness leading-out operation of FIG. 2, showing a condition in which the wire harness led out through the harness lead-out through hole is bent, and is fixed to a harness holding portion of the lower cover by a fixing member.
Figure 4:
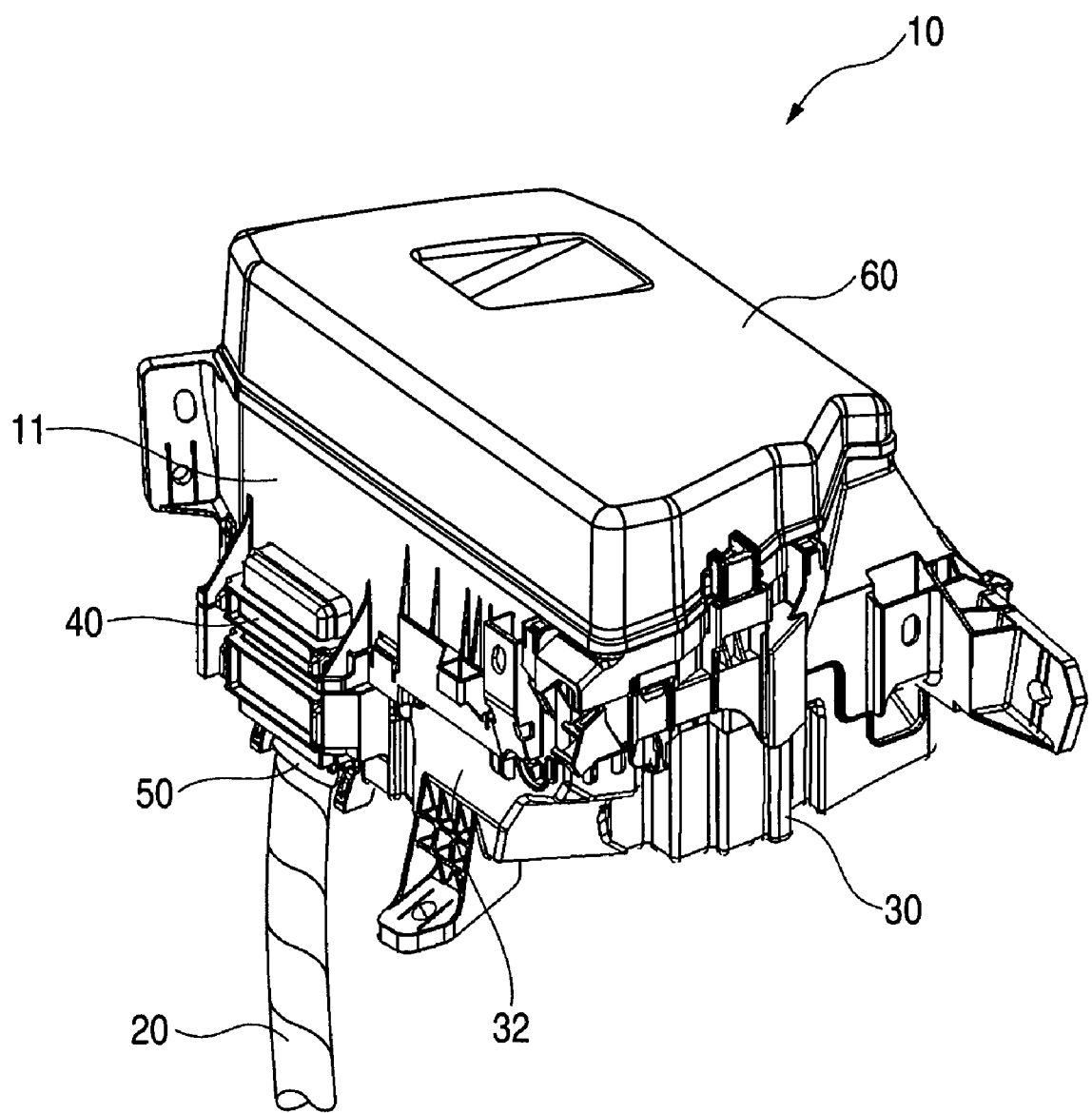
FIG. 4 is a perspective view of the electric connection box explanatory of a step next to the wire harness leading-out operation of FIG. 3, showing a condition in which a side cover is attached to the lower cover to cover an opening of the harness lead-out through hole formed in a side wall of the lower cover.

FIG. 2 is a perspective view of the electric connection box 10 explanatory of the operation for the leading-out of the wire harness 20 in the operation for assembling the electric connection box 10, showing a condition in which the lower cover 30 is attached to the lower portion of the connection box body 11, with the wire harness 20 led to the exterior through the harness lead-out through hole 33. FIG. 3 is a perspective view of the electric connection box 10 explanatory of a step next to the wire harness leading-out operation of FIG. 2, showing a condition in which the wire harness 20 led out through the harness lead-out through hole 33 is bent, and is fixed to the harness holding portion 34 of the lower cover 30 by the fixing member 50. FIG. 4 is a perspective view of the electric connection box 10 explanatory of a step next to the wire harness leading-out operation of FIG. 3, showing a condition in which the side cover 40 is attached to the lower cover 30 to cover the opening 33b of the harness lead-out through hole 33 formed in the side wall 32 of the lower cover 30. In the operation for assembling the electric connection box 10, the operation for the leading-out of the wire harness 20 is carried out in the following manner.

First, the connection box body 11 is disposed upside down (that is, the upper surface of the connection box body 11 is directed downward while the lower surface 12 of the connection box body 11 is directed upward) so that the operation for the leading-out of the wire harness 20 can be effected easily, and in this condition the wire harness 20 extending from the lower surface 12 of the connection box body 11 is passed through the harness lead-out through hole 33 in the lower cover 30. For better understanding, the electric connection box 10 shown in FIGS. 2 to 4 is not inverted, that is, not disposed upside down.

Then, the lower cover 30 is attached to the connection box body 11 while engaging a plurality of engagement portions 36 (only one of which is shown in FIGS. 2 to 4) of the lower cover 30 with respective retaining portions 14 of the connection box body 11, as shown in FIG. 2. At this time, as shown in FIG. 2, most of the wires 21 extending from the lower surface 12 of the connection box body 11 are bent partly because an inner surface (particularly the upper surface 35 of the lower wall 31 of the lower cover 30 facing away from the lower surface thereof) of the lower cover 30 is pressed against these wires 21, and the wires 21 extend along the inner surface of the lower cover 30, and are led out through the harness lead-out through hole 33 (Particularly when the wire harness 20 is thick, and can not be easily bent, the wires 21 are led to the exterior mainly through the opening 33b of the harness lead-out through hole 33 formed in the side wall 32 of the lower cover 30.).

Then, the wire harness 20 led out of the lower cover 30 is bent to extend along the harness holding portion 34, and then a predetermined portion of the wire harness 20 is fixed to the harness holding portion 34 by the fixing member 50 as shown in FIG. 3. In this electric connection box 10, a binding band is used as the fixing member 50. This binding band (fixing member 50) is passed through a through hole 34a in the harness holding portion 34 shown in FIG. 1, and is fastened tight on the outer peripheral surface of the wire harness 20. In the condition shown in FIG. 3, that portion of the wire harness 20 led out of the lower cover 30 already extends downward.

Finally, two engagement portions 41 (only one of which is shown in FIG. 3) of the side cover 40 are engaged respectively with two retaining portions 37 of the lower cover 30, thereby attaching the side cover 40 to the side wall 32 of the lower cover 30 as shown in FIG. 4.

As described above, the electric connection box 10 includes the harness holding portion 34 formed at the lower wall 31 of the lower cover 30 and extending downwardly from the lower cover 30, and the fixing member 50 fixing the wire harness 20, led out through the harness lead-out through hole 33, to the harness holding portion 34. Therefore, even if the wire harness 20 is thick, and can not easily be bent, it is only necessary to fix the wire harness 20 to the harness holding portion 34 of the lower cover 30 by the fixing member 50 and then to attach the side cover 40 to the lower cover 30. And besides, the wire harness 20 will not be unduly twisted, and therefore the efficiency of the assembling operation is good.

Furthermore, in the electric connection box 10, a surplus portion of the wire harness 20 which has heretofore been required for attaching the side cover 40 to the lower cover 30 can be completely eliminated, and this can save resources.

Furthermore, in the electric connection box 10, the harness holding portion 34 is disposed in the vicinity of the opening 33a of the harness lead-out through hole 33 formed in the lower wall 31 of the lower cover 30, and therefore the harness holding portion 34 can stably hold that portion of the wire harness 20 disposed in the vicinity of the bent portion thereof.

Furthermore, in the electric connection box 10, the harness holding portion 34 extends from that portion of the lower wall 31 defining the opening 33a of the harness lead-out through hole 33, and therefore the radius of curvature of the bent portion of the wire harness 20 can be easily made small. Therefore, the bulging of the bent portion of the wire harness 20 toward the side cover 40 can be suppressed, and therefore the wire harness will not prevent the mounting of the side cover 40 on the lower cover 30.

Furthermore, in the electric connection box 10, the upper surface 35 of the lower wall 31 of the lower cover 30 is the slanting surface slanting downwardly toward the opening 33a of the harness lead-out through hole 33, and therefore the bending of the wire harness 20 required for the leading of the wire harness 20 downwardly out of the lower cover 30 can be made gentle. Therefore, the efficiency of the operation for fixing the wire harness 20 to the harness holding portion 34 by the fixing member 50 is markedly enhanced.

The present invention is not limited to the above embodiment, and suitable modifications, improvement, etc., can be made. Also, the material, shape, form, number, disposition, etc., of each of the constituent elements of the above embodiment are arbitrary, and are not limited in so far as the invention can be achieved.

In the above electric connection box 10, as is clear from FIG. 3 and others, the connection box body 11 also has an opening which forms part of the harness lead-out through hole 33, and two retaining portions 38 for engagement respectively with two engagement portions 42 of the side cover 40 are also formed on the side wall of the connection box body 11. Therefore, when the engagement portions 41 and 42 of the side cover 40 are engaged respectively with the retaining portions 37 of the lower cover 30 and the retaining portions 38 of the connection box body 11, the side cover 40 is attached to the connection box body 11 and the lower cover 30 to close the opening 33c of the harness lead-out through hole 33 in the side wall of the connection box body 11 and the opening 33b of the harness lead-out through hole 33 in the side wall 32 of the lower cover 30. In this embodiment, although this structure is adopted also for the purpose of increasing the strength of connection between the connection box body 11 and the lower cover 30, this embodiment can be modified into a construction in which part of the harness lead-out through hole 33 is not formed in the connection box body 11, and also the retaining portions 38 for engagement with the engagement portions 42 of the side cover 40 are not formed on the side wall of the connection box body 11.

What is claimed is:

1. An electric connection box comprising:
   a connection box body;
   a wire harness extending from a lower surface of said connection box body;
   a lower cover including a lower wall, a side wall extending upwardly from a peripheral edge of said lower wall, and one continuous harness lead-out through hole formed through said lower wall and said side wall, said lower cover being removably attachable to a lower portion of said connection box body such that said wire harness is led to an exterior through said harness lead-out through hole;
   a side cover which is attached to said lower cover to cover an opening of said harness lead-out through hole in said side wall in a condition in which said wire harness is bent and led downwardly out of said lower cover through an opening of said harness lead-out through hole in said lower wall;
   harness holding portion which is formed on said lower wall and extends downwardly from said lower cover; and
   a fixing member which fixes said wire harness, led out through said harness lead-out through hole, to said harness holding portion.

2. An electric connection box according to claim 1, wherein a plurality of wires of said wire harness extend from the lower surface of said connection box body, and further extend along an upper surface of said lower wall of said lower cover, and then are bent, and extend downwardly from said lower wall of said lower cover through said harness lead-out through hole; and
   the upper surface of said lower wall is a slanting surface slanting downwardly toward the opening of said harness lead-out through hole formed in said lower wall.

3. An electric connection box according to claim 1, wherein said harness holding portion is disposed in a vicinity of the opening of said harness lead-out through hole formed in said lower wall of said lower cover.

4. An electric connection box according to claim 3, wherein said harness holding portion extends from that portion of said lower wall defining the opening of said harness lead-out through hole.

* * * * *